(12) United States Patent
Chen et al.

(10) Patent No.: US 12,279,377 B2
(45) Date of Patent: Apr. 15, 2025

(54) CONDUCTIVE SUBSTRATE AND CARRIER PLATE WIRING STRUCTURE WITH FILTERING FUNCTION, AND MANUFACTURING METHOD OF SAME

(71) Applicant: Zhuhai ACCESS Semiconductor Co., Ltd, Guangdong (CN)

(72) Inventors: Xianming Chen, Guangdong (CN); Xiaowei Xu, Guangdong (CN); Gao Huang, Guangdong (CN); Benxia Huang, Guangdong (CN)

(73) Assignee: Zhuhai ACCESS Semiconductor Co., Ltd, Guangdong (CN)

( * ) Notice: Subject to any disclaimer, the term of this patent is extended or adjusted under 35 U.S.C. 154(b) by 329 days.

(21) Appl. No.: 17/955,855

(22) Filed: Sep. 29, 2022

(65) Prior Publication Data

US 2023/0309240 A1  Sep. 28, 2023

(30) Foreign Application Priority Data

Mar. 25, 2022  (CN) .......................... 202210307677.4

(51) Int. Cl.
| | |
|---|---|
| *H05K 3/06* | (2006.01) |
| *H05K 1/02* | (2006.01) |
| *H05K 3/00* | (2006.01) |
| *H05K 3/46* | (2006.01) |

(52) U.S. Cl.
CPC .......... *H05K 3/064* (2013.01); *H05K 1/0298* (2013.01); *H05K 3/0044* (2013.01); *H05K 3/4647* (2013.01); *H05K 2201/0376* (2013.01); *H05K 2201/08* (2013.01); *H05K 2203/025* (2013.01); *H05K 2203/061* (2013.01); *H05K 2203/143* (2013.01); *H05K 2203/1446* (2013.01)

(58) Field of Classification Search
CPC ..... H05K 3/064; H05K 3/0044; H05K 3/4647
See application file for complete search history.

(56) References Cited

U.S. PATENT DOCUMENTS

2020/0344551 A1* 10/2020 Chen ...................... H05K 1/181

* cited by examiner

*Primary Examiner* — Jeremy C Norris
(74) *Attorney, Agent, or Firm* — The PL Law Group, PLLC (57) ABSTRACT

A manufacturing method for a conductive substrate with a filtering function includes preparing a core layer and forming first and second conductive holes in the core layer, forming a sacrificial copper layer on the first conductive hole and on the core layer, forming a metal layer on the second conductive hole, forming a metal post in the first conductive hole, forming a lower insulating layer on the core layer, forming a lower insulative post in the second conductive hole, forming a magnet wrapping around the metal post to obtain a first conductive post, forming an upper insulating layer on the core layer, forming an upper insulative post in the second conductive hole to obtain a second conductive post, removing the upper insulating layer, the lower insulating layer, and the remaining sacrificial copper post layer, followed by flattening.

7 Claims, 6 Drawing Sheets

CONDUCTIVE SUBSTRATE AND CARRIER PLATE WIRING STRUCTURE WITH FILTERING FUNCTION, AND MANUFACTURING METHOD OF SAME

CROSS REFERENCE TO RELATED APPLICATIONS AND CLAIM OF PRIORITY

The present application claims the benefit of Chinese Patent Application No. 202210307677.4 filed on Mar. 25, 2022 at the Chinese Intellectual Property Office, the disclosures of which are incorporated by reference herein in their entirety.

BACKGROUND

1. Technical Field

The present invention relates to the field of semiconductor packaging, and in particular to a conductive substrate and a carrier plate wiring structure with the filtering function, and a manufacturing method of the same.

2. Background of the Invention

With the rapid development of electronic technology, the size of various electronic products is decreasing, the operating frequency is also gradually increasing, the size of devices with inductors is also being gradually miniaturized, and the integration level is getting higher and higher. Although the embedding mode has been widely used, the existing manufacturing mode of wiring with magnets has a complex process, long production cycle, low quality yield, and high production cost. The complex process of magnet formation leads to the low density of wiring with magnets, which cannot meet the requirements of high integration, miniaturization, and high density wiring.

SUMMARY

Implementation schemes of the present invention relate to providing a conductive substrate and a carrier plate wiring structure with the filtering function, and a manufacturing method of the same.

The first aspect of the present invention relates to a manufacturing method for a conductive substrate with a filtering function, including steps of:
  (a) preparing a core layer, and forming at least one first conductive hole and at least one second conductive hole respectively penetrating through the core layer in a height direction in the core layer;
  (b) forming a sacrificial copper layer on an inner wall of the at least one first conductive hole and on a surface of the core layer, respectively, and forming a metal layer on the inner wall of the at least one second conductive hole;
  (c) forming the metal post in the at least one first conductive hole;
  (d) etching a part of the sacrificial copper layer on a lower surface of the core layer to expose the bottom end of the metal post, forming a lower insulating layer covering the bottom end of the metal post on the lower surface of the core layer, and forming a lower insulative post in the at least one second conductive hole;
  (e) etching a part of the sacrificial copper layer on an upper surface of the core layer and the sacrificial copper layer on the inner wall of the at least one first conductive hole, and forming a magnet wrapping around the metal post in an axial direction between the inner wall of the at least one first conductive hole and the metal post to obtain a first conductive post layer;
  (f) continuing to etch a part of the sacrificial copper layer on the upper surface of the core layer, forming an upper insulating layer covering the top end of the metal post on the upper surface of the core layer, and forming an upper insulative post in the at least one second conductive hole, the upper insulative post and the lower insulative post together forming an insulative post filling the second conductive hole to obtain a second conductive post layer;
  and (g) removing remaining sacrificial copper post layers on the upper surface and lower surface of the upper insulating layer, the lower insulating layer, and the core layer, and flattening ends of the first conductive post layer and the second conductive post layer respectively such that the end of the first conductive post layer and the end of the second conductive post layer are respectively flush with the core layer to obtain a conductive substrate with a filtering function.

In some implementation schemes, step (d) includes:
  (d1) respectively applying a first photoresist layer and a second photoresist layer on the upper surface and lower surface of the core layer, and exposing and developing the second photoresist layer to form a second feature pattern;
  (d2) etching exposed partial sacrificial copper layer on the lower surface of the core layer in the second feature pattern, and exposing the bottom end of the metal post;
  (d3) removing the first photoresist layer and the second photoresist layer;
  and (d4) laminating an insulating material on the lower surface of the core layer to form a lower insulating layer covering the bottom end of the metal post, and forming a lower insulative post in at least one second conductive hole.

In some implementation schemes, step (e) includes:
  (e1) applying a third photoresist layer on the upper surface of the core layer, and exposing and developing the third photoresist layer to form a third feature pattern exposing a top end of the at least one first conductive hole;
  (e2) etching a sacrificial copper layer on the inner wall of the at least one first conductive hole in the third feature pattern;
  (e3) removing the third photoresist layer;
  (e4) forming a magnet wrapping around the metal post in the axial direction between the inner wall of the at least one first conductive hole and the metal post;
  and (e5) flattening the magnet and the metal post to obtain a first conductive post layer.

In some implementation schemes, step (e4) includes forming a magnet wrapping around the metal post in the axial direction between the inner wall of the at least one first conductive hole and the metal post by means of silk screening.

In some implementation schemes, step (f) includes:
  (f1) respectively applying a fourth photoresist layer on the upper surface and lower surface of the core layer, and exposing and developing the fourth photoresist layer to form a fourth feature pattern;
  (f2) etching the exposed partial sacrificial copper layer on the upper surface of the core layer in the fourth feature pattern;

(f3) removing the fourth photoresist layer;

and (f4) laminating an insulating material on the upper surface of the core layer, forming an upper insulating layer covering the top end of the metal post, and forming an upper insulative post in the at least one second conductive hole, the upper insulative post and the lower insulative post together forming an insulative post filling the second conductive hole to obtain a second conductive post layer.

The second aspect of the present invention relates to a manufacturing method for a carrier plate wiring structure, including steps of:

(a) preparing a conductive substrate with a filtering function by using the manufacturing method for a conductive substrate with a filtering function according to the first aspect of the present invention;

and (b) respectively forming a first circuit layer and a second circuit layer on an upper surface and a lower surface of the conductive substrate, wherein the first circuit layer and the second circuit layer are conductively connected through the first conductive post layer or the second conductive post layer.

In some implementation schemes, the invention further includes:

(c), following step (b), respectively forming a first adding layer and a second adding layer on the first circuit layer and the second circuit layer, respectively forming a first copper post layer and a second copper post layer in the first adding layer and the second adding layer, and respectively forming a third circuit layer and a fourth circuit layer on the surfaces of the first adding layer and the second adding layer respectively, wherein the first circuit layer and the third circuit layer are conductively connected through the first copper post layer, and the second circuit layer and the fourth circuit layer are conductively connected through the second copper post layer;

and (j) forming a third adding layer and a fourth adding layer on the third circuit layer and the fourth circuit layer respectively, forming a third copper post layer and a fourth copper post layer in the third adding layer and the fourth adding layer respectively, and forming a fifth circuit layer and a sixth circuit layer on the surfaces of the third adding layer and the fourth adding layer respectively, wherein the third circuit layer and the fifth circuit layer are conductively connected through the third copper post layer, and the fourth circuit layer and the sixth circuit layer are conductively connected through the fourth copper post layer.

The third aspect of the present invention relates to a conductive substrate with a filtering function, which is prepared by using the manufacturing method for a conductive substrate with a filtering function according to the first aspect of the present invention.

In some implementation schemes, the invention includes a core layer, and a first conductive post layer and a second conductive post layer respectively penetrating through the core layer in a height direction, wherein the conductive post in the first conductive post layer includes a metal post and a magnet wrapping around the metal post in an axial direction, and the conductive post in the second conductive post layer includes an insulative post and a metal layer wrapping around the metal post in the axial direction, the first conductive post layer with a filtering function.

In some implementation schemes, the end of the first conductive post layer is flush with or higher than the core layer, and the end of the second conductive post layer is flush with or higher than the core layer.

In some implementation schemes, the insulative post is selected from a pure resin or a resin containing glass fiber.

In some implementation schemes, the core layer includes polyimide, epoxy an epoxy resin, a bismaleimide/triazine resin, a polyphenyl ether, a polyacrylate, a prepreg, a film-like organic resin, or a combination thereof.

In some implementation schemes, the metal post includes a mixed metal that is etch-resistant and has low resistivity and high thermal conductivity properties.

The fourth aspect of the present invention provides a carrier plate wiring structure including the conductive substrate with a filtering function according to the first aspect of the present invention.

In some implementation schemes, the invention further includes a first circuit layer on the first side of the conductive substrate, and a second circuit layer on the second side of the conductive substrate, the first circuit layer and the second circuit layer being conductively connected through the first conductive post layer or the second conductive post layer.

In some implementation schemes, the invention further includes a first adding layer on the first circuit layer, a first copper post layer in the first adding layer, a third circuit layer on a surface of the first adding layer, a third adding layer on the third circuit layer, a third copper post layer in the third adding layer, and a fifth circuit layer on the third adding layer, the first circuit layer and the third circuit layer being conductively connected through the first copper post layer, and the third circuit layer and the fifth circuit layer being conductively connected through the third copper post layer.

In some implementation schemes, the invention further includes a second adding layer on the second circuit layer, a second copper post layer in the second adding layer, a fourth circuit layer on the surface of the second adding layer, a fourth adding layer on the fourth circuit layer, a fourth copper post layer in the fourth adding layer, and a sixth circuit layer on the fourth adding layer, the second circuit layer and the fourth circuit layer being conductively connected through the second copper post layer, and the fourth circuit layer and the sixth circuit layer being conductively connected through the fourth copper post layer.

It can be seen from the above that according to the conductive substrate and carrier plate wiring structure with a filtering function and the manufacturing method for the same provided by the present invention, when the internal wiring of a magnet is performed, there is no need to add an insulating layer. A magnetic cavity is directly formed around a metal post, and the density of wiring with a magnet is increased, satisfying the development trend of high integration, miniaturization, and micromation. Low resistivity and high thermal conductivity mixed metal material is used to manufacture the inner metal post of the magnet so as to reduce the resistance value of the conductive post, and the internal thermal of the magnet can be quickly conducted out, thereby improving the reliability of the magnet burying products. The manufacturing method for a conductive substrate with the filtering function shortens the manufacturing process of the magnetic substrate, simplifies the production process, improves the production yield, and reduces the production cost.

BRIEF DESCRIPTION OF THE DRAWINGS

For a better understanding of the invention and to show the embodiment thereof, reference is now made, purely by way of example, to the accompanying drawings.

When referring to the accompanying drawings, it must be emphasized that the specific illustrations are exemplary and only for the purpose of demonstrative discussion of the preferred embodiments of the present invention, and are presented based on the provision that they are considered to be the most useful and understandable illustration of the description of the principles and concepts of the present invention. In this regard, no attempt is made to show structural details of the invention in more detail than is necessary for a fundamental understanding of the invention; the description with reference to the drawings will enable one skilled in the art to recognize how the several forms of the invention may be embodied in practice. In the drawings.

DETAILED DESCRIPTION OF THE INVENTION

With the rapid development of electronic technology, the size of various electronic products is gradually decreasing, the operating frequency is also gradually increasing, the size of devices with inductors is also being gradually miniaturized, and the integration level is getting higher and higher.

In the prior art, manufacturing wiring with a magnet is implemented by means of embedding, for example, using mechanical drilling, mechanical gongs, and laser cutting to make openings according to requirements, filling a magnetic material in the opening of the substrate by means of packing, and after curing, removing an excess carrier protruding from or attached to the surface by means of mechanical grinding; forming a required magnet, forming a first through-hole on the magnet by using a machining method such as mechanical drilling, laser, etc., filling an insulating material into the first through-hole by packing, grinding and removing an excessive insulator protruding from or attached to the surface by means of the same method, continuing to manufacture a second through-hole, electroplating the second through-hole to form an inner conductor of the magnet, and then making a second through-hole insulator filling.

However, the process of completing wiring with a magnet on a substrate in the prior art is complicated: filling a magnet to make a substrate opening, making a through-hole in the magnet to fill an insulating layer, making a conductor in an insulator, and filling the insulator again to form a through-hole for many times, which requires a high alignment accuracy such that dense wiring cannot be realized, the process is complicated, the production cycle is long, and the production cost is high. Furthermore, in the manufacture of the wiring substrate with a magnet, grinding is repeated, causing the increase in the expansion and shrinkage, and deformation of the substrate, which directly affects the quality yield of the substrate, and increases the production capacity pressure and the production cost.

In order to solve this problem, the present invention provides a manufacturing method for a conductive substrate with a filtering function, including preparing a core layer and forming at least one first conductive hole and at least one second conductive hole in the core layer, forming a sacrificial copper layer on the inner wall of the first conductive hole and the surface of the core layer and forming a metal layer on the inner wall of the second conductive hole, forming a metal post in the first conductive hole, forming a lower insulating layer covering the bottom end of the metal post on the lower surface of the core layer and forming a lower insulative post in the second conductive hole, forming a magnet wrapping the metal post along the axial direction between the inner wall of the first conductive hole and the metal post to obtain a first conductive post, forming an upper insulating layer covering the top end of the metal post on the upper surface of the core layer and forming an upper insulative post in the second conductive hole, the upper insulative post and the lower insulative post together forming an insulative post filling the second conductive hole to obtain a second conductive post, removing the upper insulating layer, the lower insulating layer and the remaining sacrificial copper post layer, and respectively flattening the ends of the first conductive post and the second conductive post.

When the internal wiring of a magnet is performed in the present invention, there is no need to add an insulating layer. A magnetic cavity is directly formed around a conductive post, and the density of wiring with a magnet is increased, satisfying the development trend of high integration, miniaturization, and micromation. Low resistivity and high thermal conductivity mixed metal material is used to manufacture the inner conductive post of the magnet so as to reduce the resistance value of the conductive post, and the internal thermal of the magnet can be quickly conducted out, thereby improving the reliability of the magnet burying products. The manufacturing method for a conductive substrate with the filtering function shortens the manufacturing process of the magnetic substrate, simplifies the production process, improves the production yield, and reduces the production cost.

Figure 1:
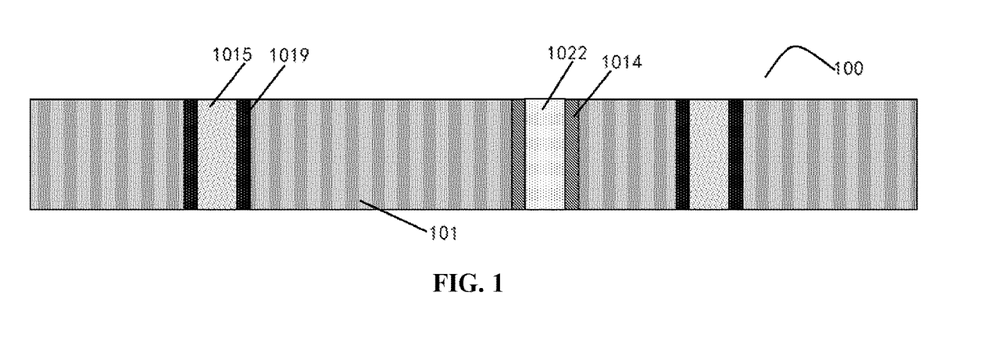
FIG. 1 is a schematic cross-sectional view of a conductive substrate 100 with a filtering function according to one embodiment of the present invention.

Referring to FIG. 1, a schematic cross-sectional view of a conductive substrate 100 with a filtering function is shown. The conductive substrate 100 includes a core layer 101. Generally, the core layer 101 may include polyimide, epoxy resin, bismaleimide/triazine resin, polyphenyl ether, polyacrylate, prepreg, film-like organic resin, or a combination thereof.

A first conductive post layer and a second conductive post layer which respectively penetrate through the core layer in the height direction are provided in the core layer 101; the conductive post in the first conductive post layer includes a metal post 1015 and a magnet 1019 which wraps around the metal post 1015 in the axial direction; the first conductive post has a filtering function.

The metal post 1015 may include a mixed metal that is etch-resistant and has low resistivity and high thermal conductivity properties, for example, a silver mixture or a gold mixture, and no specific limitation is made.

In general, the first conductive post layer may include multiple conductive posts having the same or different cross-sectional sizes and the same or different cross-sectional shapes. Preferably, the cross-sectional shape of the first conductive post layer is circular, and the upper size and lower size are uniform, which is more advantageous for filtering. The internal thermal of the magnet is conducted out to improve the reliability of the magnet burying product.

The end of the first conductive post layer may be flush with the core layer 101 or may be higher than the core layer 101; preferably, the end of the first conductive post layer is flush with the core layer 101.

The conductive post in the second conductive post layer includes an insulation column 1022 and a metal layer 1014 wrapping around the insulation column 1022 in an axial direction; the insulative post may be selected from pure resin or a resin containing glass fiber.

In general, the second conductive post layer may also include multiple conductive posts having the same or different cross-sectional sizes and the same or different cross-sectional shapes. Preferably, the cross-sectional shape of the second conductive post layer is circular, and the upper size and lower size are uniform, making it more advantageous for signal transmission stability.

The end of the second conductive post layer may be flush with the core layer or may be higher than the core layer; preferably, the end of the second conductive post layer is flush with the core layer.

Figure 2:
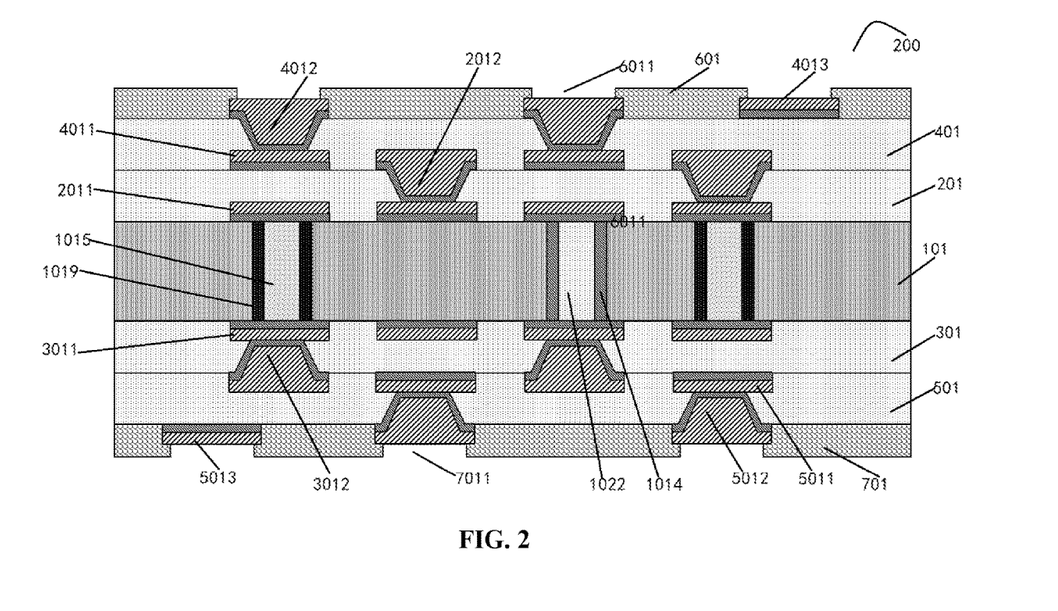
FIG. 2 is a schematic cross-sectional view of a carrier plate wiring structure 200 according to one embodiment of the present invention.

Referring to FIG. 2, a schematic cross-sectional view of a carrier plate wiring structure 200 is shown. The carrier plate wiring structure 200 includes the conductive substrate 100 with the filtering function as shown in FIG. 1, and further includes a first circuit layer 2011 on the first side of the conductive substrate 100, and a second circuit layer 3011 on the second side of the conductive substrate 100. The first circuit layer 2011 and the second circuit layer 3011 are conductively connected through a first conductive post layer or a second conductive post layer.

The first adding layer 201 is provided on the first circuit layer 2011, the first copper post layer 2012 is provided in the first adding layer 201, the third circuit layer 4011 is provided on the surface of the first adding layer 201, and the first circuit layer 2011 and the third circuit layer 4011 are conductively connected through the first copper post layer 2012.

The third adding layer 401 is provided on the third circuit layer 4011, the third copper post layer 4012 is provided in the third adding layer 401, the fifth circuit layer 4013 is provided on the surface of the third adding layer 401, and the third circuit layer 4011 and the fifth circuit layer 4013 are conductively connected through the third copper post layer 4012.

The second adding layer 301 is provided on the second circuit layer 3011, the second copper post layer 3012 is provided in the second adding layer 301, the fourth circuit layer 5011 is provided on the surface of the second adding layer 301, and the second circuit layer 3011 and the fourth circuit layer 5011 are conductively connected through the second copper post layer 3012.

The fourth adding layer 501 is provided on the fourth circuit layer 5011, the fourth copper post layer 5012 is provided in the fourth adding layer 501, the sixth circuit layer 5013 is provided on the surface of the fourth adding layer 501, and the fourth circuit layer 5011 and the sixth circuit layer 5013 are conductively connected through the fourth copper post layer 5012.

The first solder mask 601 is provided outside the fifth circuit layer 4013, the first solder resist window 6011 is provided inside the first solder mask 601, the second solder mask 701 is provided outside the sixth circuit layer 5013, and the second solder resist window 7011 is provided in the second solder mask 701.

Referring to FIGS. 3A-3M, there are shown schematic cross-sectional views of intermediate structures at various steps of a manufacturing method for a carrier plate wiring structure 200 according to one implementation scheme of the present invention.

Figure 3A:
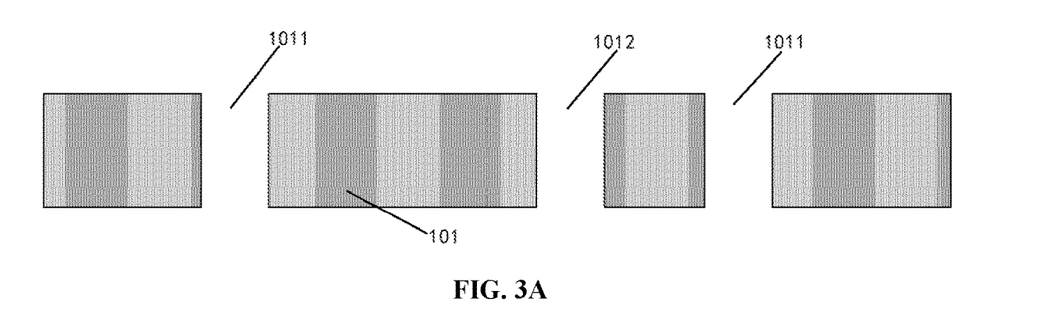
FIGS. 3A-3M show schematic cross-sectional views of intermediate structures at various steps of a manufacturing method for a carrier plate wiring structure 200 according to one implementation scheme of the present invention.

The manufacturing method includes the following steps: preparing a core layer 101, and forming, in the core layer 101, at least one first conductive hole 1011 and at least one second conductive hole 1012, which respectively penetrate through the core layer 101 in the height direction—step (a), as shown in FIG. 3A.

In general, the core layer 101 may be a double-sided copper-clad core plate or a double-sided copper-free core plate.

The core layer 101 may include polyimide, epoxy an epoxy resin, a bismaleimide/triazine resin, a polyphenyl ether, a polyacrylate, a prepreg, a film-like organic resin, or a combination thereof.

Figure 3B:
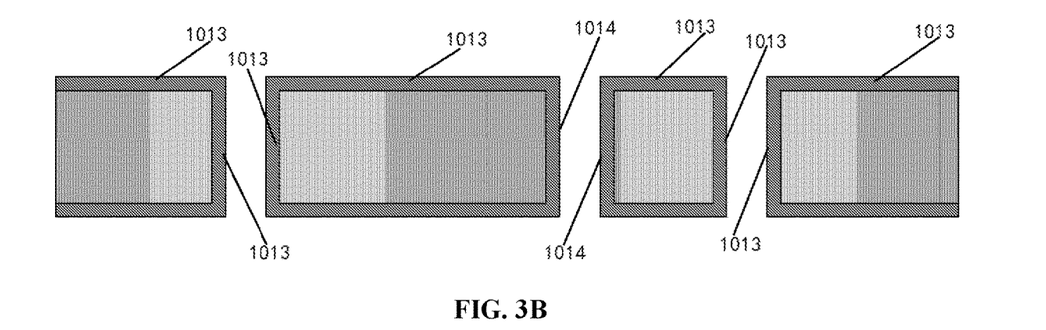

The core layer referred to in this implementation mode may be a double-sided copper-clad core plate or a double-sided copper-free core plate, which may be selected as desired. The subsequent process is only demonstrated for a double-sided copper-free core plate, but the method is not limited thereto, Next, a sacrificial copper layer 1013 is formed on the inner wall of the first via 1011 and on the surface of the core layer 101, respectively, and a metal layer 1014 is formed on the inner wall of the second via 1012—step (b), as shown in FIG. 3B.

In general, metal seed layers may be formed on the inner wall of the first conductive hole 1011, the surface of the core layer 101, and the inner wall of the second conductive hole 1012 by means of electroless plating or sputtering, respectively, and then electroplating is performed on the metal seed layers to the desired copper thickness, respectively, to obtain a sacrificial copper layer 1013 and a metal layer 1014.

Figure 3C:
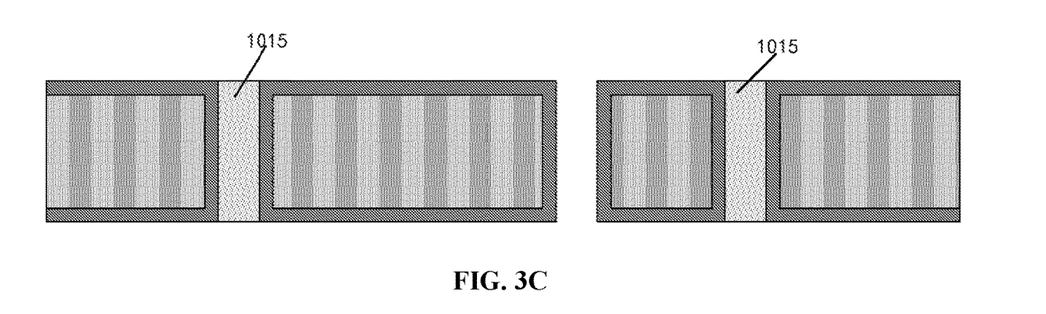

Then, a metal post 1015 is formed in the first conductive hole 1011—step (c), as shown in FIG. 3C.

Generally, a mixed metal material that can resist etching and has low resistivity and high thermal conductivity properties can be selected to make the metal post 1015; the mixed metal material may be a silver mixture or a gold mixture, etc. without being limited.

In this implementation scheme, the low resistivity and high thermal conductivity mixed metal material is used to make the metal post in the magnet so as to reduce the resistance value of the metal post such that the internal thermal of the magnet can be quickly conducted out and the reliability of the magnet burying product can be improved.

In this implementation scheme, metal posts 1015 may first be formed in the first conductive hole 1011 by using silk screening, then curing is performed, and finally, the mechanically plate grinding is performed such that the end of the metal post 1015 is flush with the core layer 101.

Figure 3D:
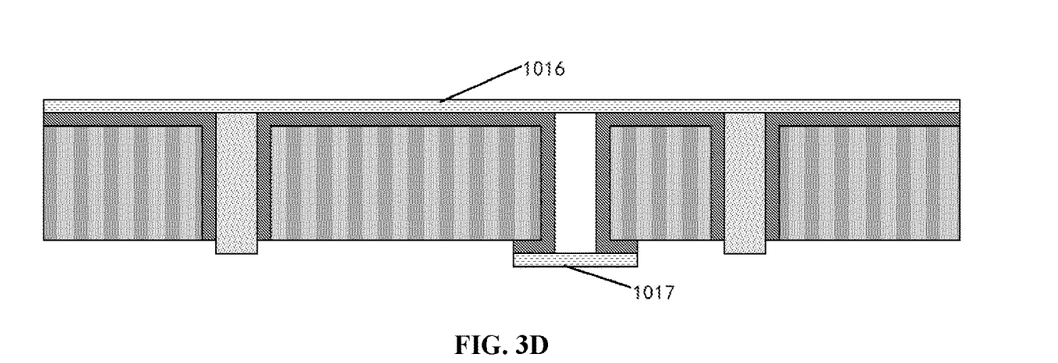

Next, a first photoresist layer 1016 and a second photoresist layer 1017 are respectively applied on the upper surface and lower surface of the core layer 101, the second photoresist layer 1017 is exposed and developed to form a second feature pattern, and a part of the sacrificial copper layer on the lower surface of the exposed core layer 101 is etched in the second feature pattern to expose the bottom end of the metal post 1015—step (d), as shown in FIG. 3D.

In general, the photoresist layer may be applied by filming laminating or coating.

Figure 3E:
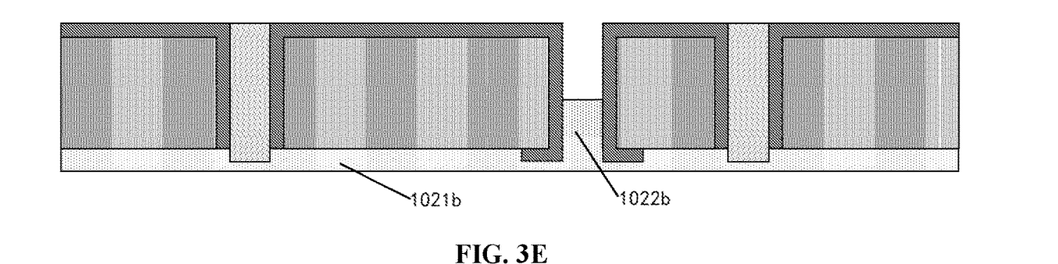

Then, the first photoresist layer 1016 and the second photoresist layer 1017 are removed, and an insulating material is laminated on the lower surface of the core layer 101 to form a lower insulating layer 1021*b* covering the bottom end of the metal post 1015, and a lower insulative post 1022*b* in the second conductive hole 1012—step (e), as shown in FIG. 3E.

Generally, the insulating material can be selected from pure resin or a resin containing glass fiber, as desired.

Alternatively, the insulating material may be laminated by coating or pressing.

Figure 3F:
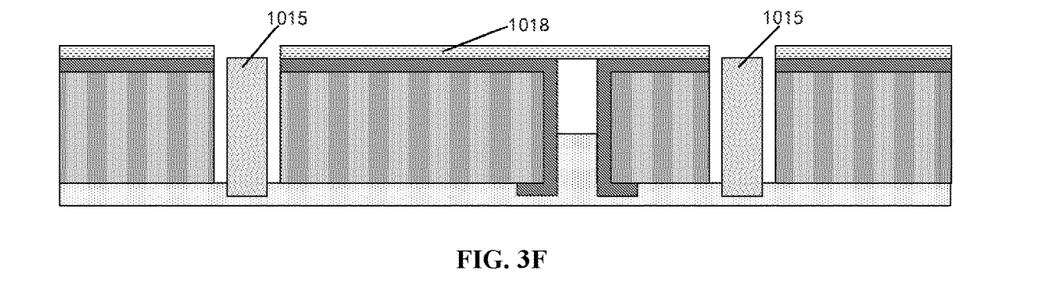

Next, a third photoresist layer 1018 is applied on the upper surface of the core layer 101, the third photoresist layer 1018 is exposed and developed to form a third feature pattern exposing the top end of the first conductive hole 1011, and the sacrificial copper layer on the inner wall of the first conductive hole 1011 is etched in the third feature pattern—step (f), as shown in FIG. 3F.

Figure 3G:
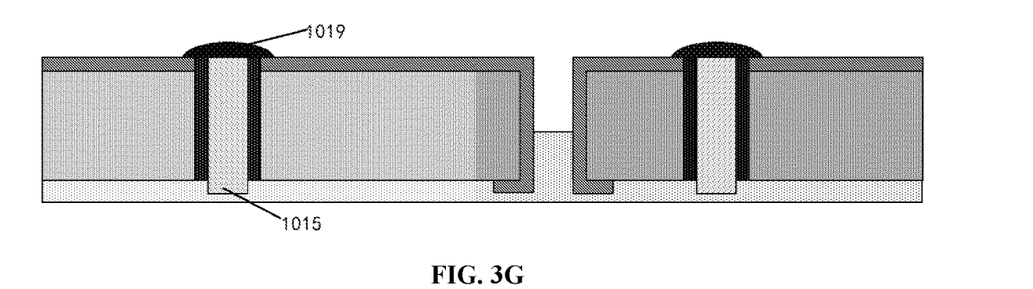

Then, the third photoresist layer 1018 is removed, and a magnet 1019 wrapping around the metal post 1015 in the axial direction is formed between the inner wall of the first conductive hole 1011 and the metal post 1015—step (g), as shown in FIG. 3G.

In general, magnet 1019 may be formed by silk screening.

In this implementation scheme, it is unnecessary to add an insulating layer to the internal wiring of the magnet, and a magnetic cavity is directly formed around the metal post such that the density of wiring with a magnet is increased, satisfying the developing trend of high integration, miniaturization, and micromation.

Figure 3H:
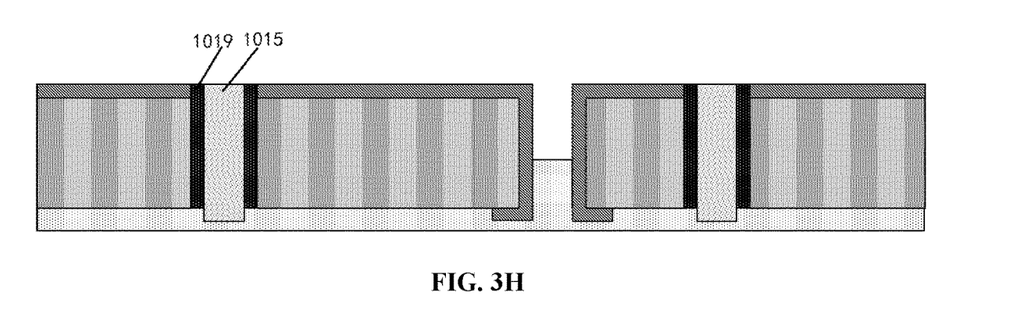

Next, the magnet 1019 and the metal post 1015 are flattened to obtain a first conductive post layer—step (h), as shown in FIG. 3H. Generally, the top end of the first conductive post layer may be flush with the sacrificial copper layer 1013.

Figure 3I:
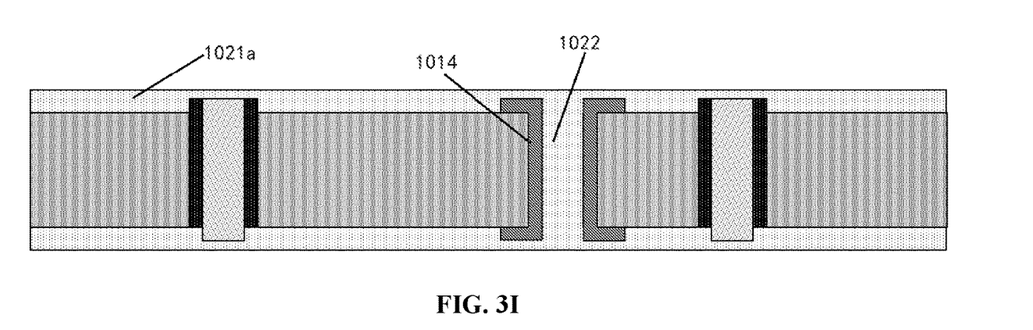

Then, respectively applying fourth photoresist layers to the upper surface and lower surface of the core layer 101, exposing and developing the fourth photoresist layer to form a fourth feature pattern, etching a part of the sacrificial copper layer on the upper surface of the exposed core layer 101 in the fourth feature pattern, removing the fourth photoresist layer, laminating an insulating material on the upper surface of the core layer 101 to form an upper insulating layer 1021a covering the top end of the metal post 1015, and forming an upper insulative post in the second conductive hole 1012, wherein the upper insulative post and the lower insulative post 1022b together form an insulative post 1022 filling the second conductive hole 1012, and the metal layer 1014 and the insulating pillars 1022 together form a second conductive post layer—step (i), as shown in FIG. 3I.

Figure 3J:
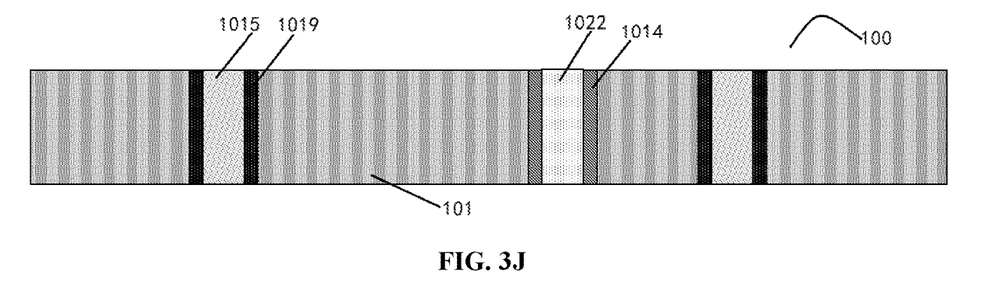

Then, the remaining sacrificial copper post layers on the upper surface and lower surface of the upper insulating layer 1021a, the lower insulating layer 1021b, and the core layer 101 are removed, and the ends of the first conductive post layer and the second conductive post layer are respectively flattened, and the end of the first conductive post layer and the end of the second conductive post layer are respectively flush with the core layer 101 to obtain a conductive substrate 100 with a filtering function—step (j), as shown in FIG. 3J.

The remaining sacrificial copper post layers on the upper surface and lower surface of the upper insulating layer 1021a, the lower insulating layer 1021b, and the core layer 101 can be removed by mechanically plate grinding.

When the conductive substrate is prepared in this implementation scheme, the manufacturing process of the substrate with a magnet is shortened, the production process is simplified, the production yield is improved, and the production cost is reduced.

Figure 3K:
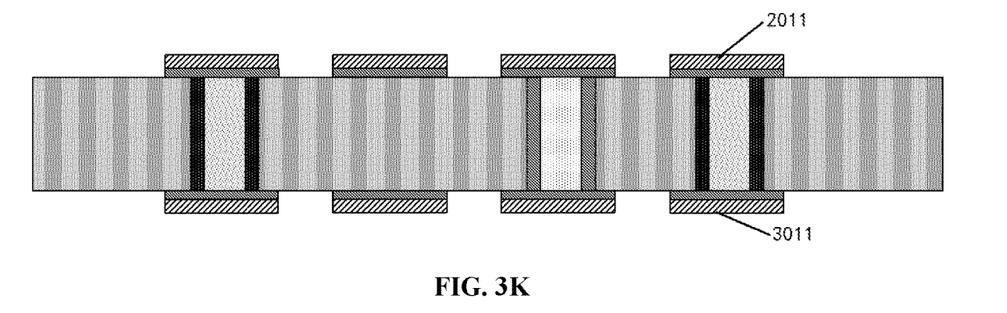

Then, a first circuit layer 2011 and a second circuit layer 3011 are respectively formed on the upper surface and lower surface of the conductive substrate 100, and the first circuit layer 2011 and the second circuit layer 3011 are conductively connected through the first conductive post layer or the second conductive post layer to obtain a substrate wiring structure with a filtering function—step (k), as shown in FIG. 3K.

Generally, it can be prepared by the following steps:
respectively forming a first metal seed layer and a second metal seed layer on the upper surface and lower surface of the conductive substrate 100;
respectively applying a fifth photoresist layer and a sixth photoresist layer on the first metal seed layer and the second metal seed layer, and exposing and developing to form a fifth feature pattern and a sixth feature pattern;
electroplating in the fifth feature pattern and the sixth feature pattern, respectively, to form a first circuit layer 2011 and a second circuit layer 3011;
and removing the fifth photoresist layer and the sixth photoresist layer, and etching and exposing the first metal seed layer and the second metal seed layer.

Figure 3L:
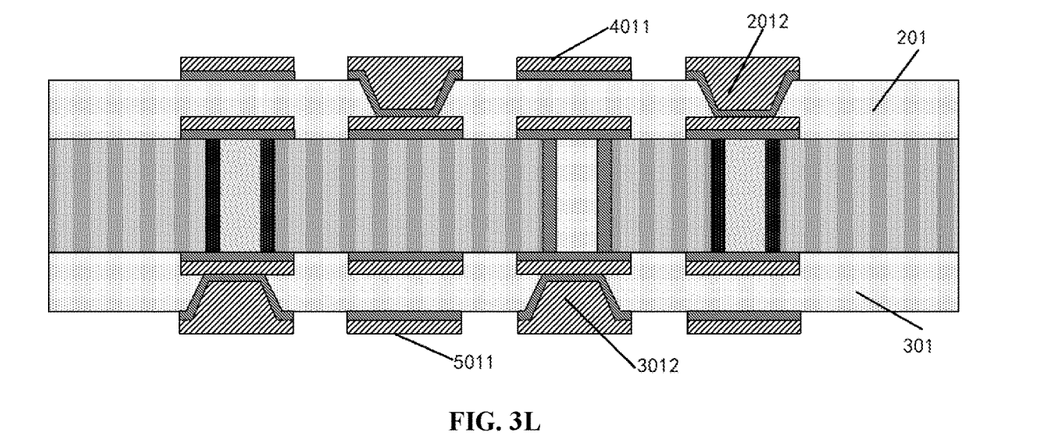

Next, a first adding layer 201 and a second adding layer 301 are respectively formed on the first circuit layer 2011 and the second circuit layer 3011, a first copper post layer 2012 and a second copper post layer 3012 are respectively formed in the first adding layer 201 and the second adding layer 301, a third circuit layer 4011 and a fourth circuit layer 5011 are respectively formed on the surfaces of the first adding layer 201 and the second adding layer 301, the first circuit layer 2011 and the third circuit layer 4011 are conductively connected through the first copper post layer 2012, and the second circuit layer 3011 and the fourth circuit layer 5011 are conductively connected through the second copper post layer 3012—step (l), as shown in FIG. 3L.

In general, the adding layer, the copper post layer located within the adding layer, and the circuit layer located on the surface of the adding layer may be prepared by a process of laser drilling in the adding layer→making a seed layer on the surface of the adding layer and the sidewalls and bottom of the hole→applying a photoresist layer on the seed layer→forming a feature pattern by exposing and developing→electroplating in the feature pattern to form a circuit layer and a copper post layer→removing the photoresist layer and etching the exposed seed layer.

Figure 3M:
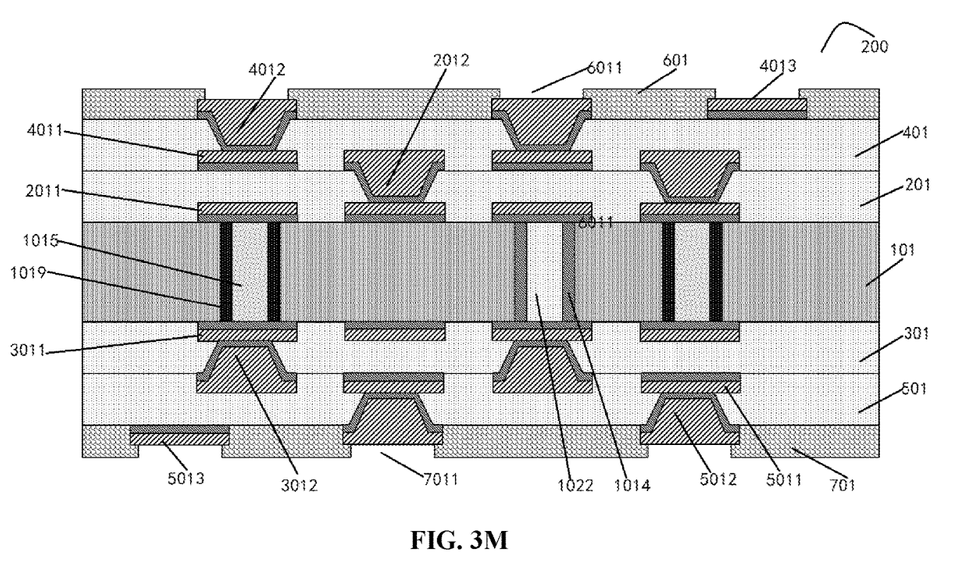

Finally, a third adding layer 401 and a fourth adding layer 501 are respectively formed on the third circuit layer 4011 and the fourth circuit layer 5011, a third copper post layer 4012 and a fourth copper post layer 5012 are respectively formed in the third adding layer 401 and the fourth adding layer 501, and a fifth circuit layer 4013 and a sixth circuit layer 5013 are respectively formed on the surfaces of the third adding layer 401 and the fourth adding layer 501; the third circuit layer 4011 and the fifth circuit layer 4013 are conductively connected through the third copper post layer 4012, the fourth circuit layer 5011 and the sixth circuit layer 5013 are conductively connected through the fourth copper post layer 5012, a first solder mask 601 is formed outside the third adding layer 401 and a first solder mask window 6011 is formed inside the first solder mask 601, a second solder mask 701 is formed outside the fourth adding layer 501, and a second solder mask window 7011 is formed inside the second solder mask 701 so as to obtain the carrier plate wiring structure 200—step (m), as shown in FIG. 3M.

It will be appreciated by persons skilled in the art that the present invention is not limited by what has been particularly shown and described hereinabove. Furthermore, the scope of the invention is defined by the appended claims, including combinations and sub-combinations of the various technical features described hereinabove, as well as variations and modifications thereof, which would occur to persons skilled in the art upon reading the foregoing description.

In the claims, the term "comprising" and variations thereof such as "comprises", "comprise", and the like, mean that the recited assembly is included, but generally other assemblies are not excluded.

What is claimed is:

1. A method for manufacturing a conductive substrate with a filtering function, the comprising:
   (a) preparing a core layer, and forming at least one first conductive hole and at least one second conductive hole respectively penetrating through the core layer in a height direction in the core layer;
   (b) forming a sacrificial copper layer on an inner wall of the at least one first conductive hole and on a surface of the core layer, respectively, and forming a metal layer on the inner wall of the at least one second conductive hole;
   (c) forming the metal post in the at least one first conductive hole;
   (d) etching a part of the sacrificial copper layer on a lower surface of the core layer to expose a bottom end of the metal post, forming a lower insulating layer covering the bottom end of the metal post on the lower surface of the core layer, and forming a lower insulative post in the at least one second conductive hole;
   (e) etching a part of the sacrificial copper layer on an upper surface of the core layer and the sacrificial copper layer on the inner wall of the at least one first conductive hole, and forming a magnet wrapping around the metal post in an axial direction between the inner wall of the at least one first conductive hole and the metal post to obtain a first conductive post layer;
   (f) continuing to etch a part of the sacrificial copper layer on the upper surface of the core layer, forming an upper insulating layer covering a top end of the metal post on the upper surface of the core layer, and forming an upper insulative post in the at least one second conductive hole, the upper insulative post and the lower insulative post together forming an insulating column filling the second conductive hole to obtain a second conductive post layer; and
   (g) removing remaining sacrificial copper post layers on the upper surface and lower surface of the upper insulating layer, the lower insulating layer, and the core layer, and grinding ends of the first conductive post layer and the second conductive post layer respectively such that the end of the first conductive post layer and the end of the second conductive post layer are respectively flush with the core layer to obtain a conductive substrate with a filtering function.

2. The method of claim 1, wherein step (d) comprises:
   (d1) respectively applying a first photoresist layer and a second photoresist layer on the upper surface and lower surface of the core layer, and exposing and developing the second photoresist layer to form a second feature pattern;
   (d2) etching exposed partial sacrificial copper layer on the lower surface of the core layer in the second feature pattern, and exposing the bottom end of the metal post;
   (d3) removing the first photoresist layer and the second photoresist layer; and
   (d4) laminating an insulating material on the lower surface of the core layer to form a lower insulating layer covering the bottom end of the metal post, and forming a lower insulative post in the at least one second conductive hole.

3. The method of claim 1, wherein step (e) comprises:
   (e1) applying a third photoresist layer on the upper surface of the core layer, and exposing and developing the third photoresist layer to form a third feature pattern exposing a top end of the at least one first conductive hole;
   (e2) etching a sacrificial copper layer on the inner wall of the at least one first conductive hole in the third feature pattern;
   (e3) removing the third photoresist layer;
   (e4) forming a magnet wrapping around the metal post in the axial direction between the inner wall of the at least one first conductive hole and the metal post; and
   (e5) flattening the magnet and the metal post to obtain a first conductive post layer.

4. The method of claim 3, wherein step (e4) comprises forming a magnet wrapping around the metal post in the axial direction between the inner wall of the at least one first conductive hole and the metal post by means of silk screening.

5. The method of claim 1, wherein step (f) comprises:
   (f1) respectively applying a fourth photoresist layer on the upper surface and lower surface of the core layer, and exposing and developing the fourth photoresist layer to form a fourth feature pattern;
   (f2) etching the exposed partial sacrificial copper layer on the upper surface of the core layer in the fourth feature pattern;
   (f3) removing the fourth photoresist layer; and
   (f4) laminating an insulating material on the upper surface of the core layer, forming an upper insulating layer covering the top end of the metal post, and forming an upper insulative post in the at least one second conductive hole, the upper insulative post and the lower insulative post together forming an insulative post filling the second conductive hole, and the metal layer and the insulative post together forming a second conductive post layer.

6. A method for manufacturing a carrier plate wiring structure, the method comprising:
   (a) preparing the conductive substrate with a filtering function manufactured by the method of claim 1; and
   (b) respectively forming a first circuit layer and a second circuit layer on an upper surface and a lower surface of the conductive substrate, wherein the first circuit layer and the second circuit layer are conductively connected through the first conductive post layer or the second conductive post layer.

7. The method of claim 6, further comprising:
   (c), following step (b), respectively forming a first adding layer and a second adding layer on the first circuit layer and the second circuit layer, respectively forming a first copper post layer and a second copper post layer in the first adding layer and the second adding layer, and respectively forming a third circuit layer and a fourth circuit layer on the surfaces of the first adding layer and the second adding layer respectively, wherein the first circuit layer and the third circuit layer are conductively connected through the first copper post layer, and the second circuit layer and the fourth circuit layer are conductively connected through the second copper post layer; and
   (j) forming a third adding layer and a fourth adding layer on the third circuit layer and the fourth circuit layer respectively, forming a third copper post layer and a fourth copper post layer in the third adding layer and the fourth adding layer respectively, and forming a fifth circuit layer and a sixth circuit layer on the surfaces of the third adding layer and the fourth adding layer respectively, wherein the third circuit layer and the fifth circuit layer are conductively connected through the third copper post layer, and the fourth circuit layer and the sixth circuit layer are conductively connected through the fourth copper post layer.

* * * * *